United States Patent
Mizuhara

[11] 3,970,952
[45] July 20, 1976

[54] BROADBAND OUTPUT CIRCUIT FOR KLYSTRON AMPLIFIER

[75] Inventor: Albert Mizuhara, San Mateo, Calif.

[73] Assignee: The United States of America as represented by the Secretary of the Navy, Washington, D.C.

[22] Filed: May 15, 1975

[21] Appl. No.: 577,960

[52] U.S. Cl. .............................. 330/45; 315/5.21; 315/5.53; 330/56
[51] Int. Cl.² .......................................... H03F 3/56
[58] Field of Search ................. 330/45, 49, 53, 56; 331/83; 332/7; 315/5.21, 5.53

[56] References Cited
UNITED STATES PATENTS
3,704,429  11/1972  Sigmon ............................ 330/56 X FOREIGN PATENTS OR APPLICATIONS
244,166  10/1960  Australia ........................... 315/5.53

Primary Examiner—James B. Mullins
Attorney, Agent, or Firm—R. S. Sciascia; L. I. Shrago

[57] ABSTRACT

A lightweight, tunable, wideband output circuit for a klystron amplifier employs a first cavity resonator which is excited by the modulated electron beam and a filter cavity resonator coupled thereto which is provided with a coaxial probe that both capacitatively tunes this resonator and serves as a means for extracting the output signal therefrom in a mode-free manner.

6 Claims, 3 Drawing Figures

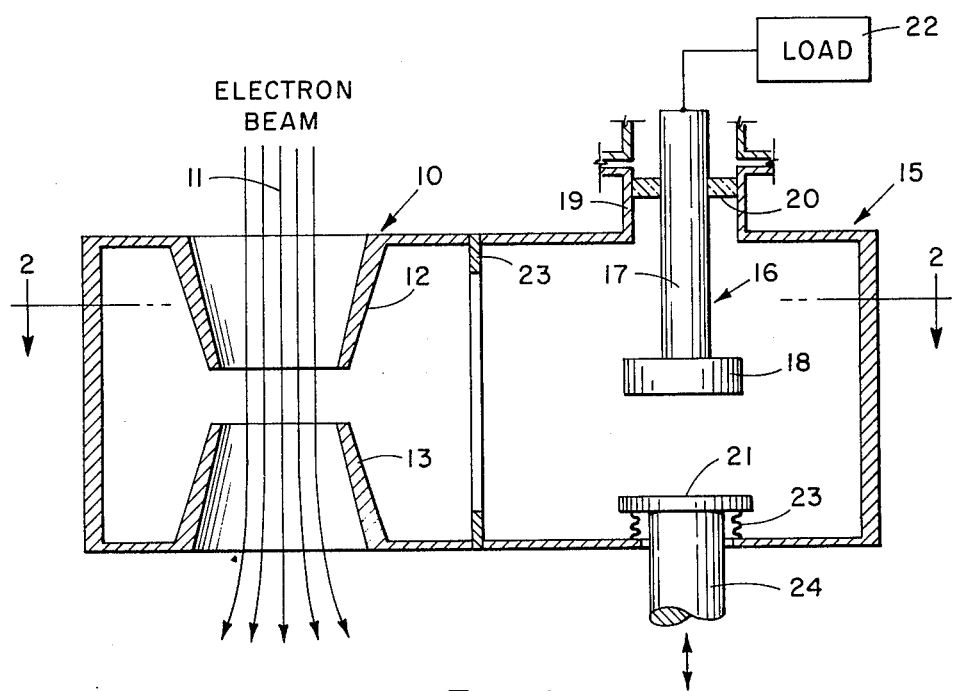
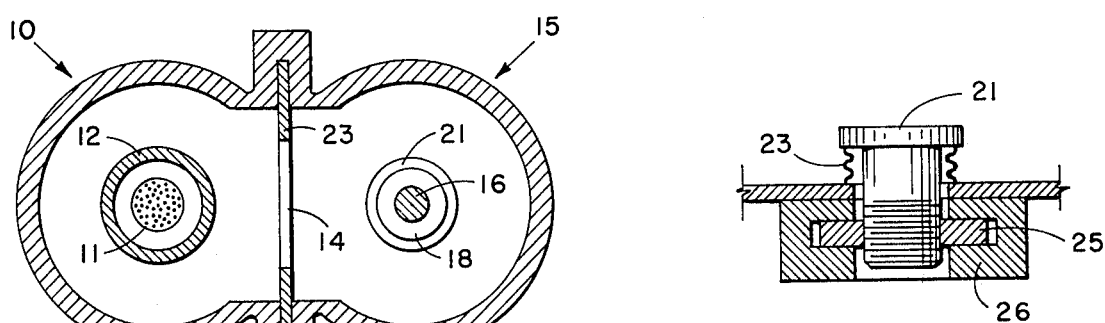
Fig. 1
Fig. 2
Fig. 3

BROADBAND OUTPUT CIRCUIT FOR KLYSTRON AMPLIFIER

The present invention relates generally to amplifiers utilizing linear beam tubes and, more particularly, to a tunable klystron amplifier having an improved bandwidth.

Klystron amplifiers usually have fairly narrow bandwidths because their output circuit conventionally consists of a high Q cavity that is coupled directly to the load through either a loop or iris. The instantaneous bandwidth of such an amplifier may, therefore, be only one-half percent or less.

For these narrow bandwidths, the output gap impedance is usually high enough to permit good beam coupling and efficiencies. However, as the requirement for bandwidth increases, the output cavity-to-load coupling must also be increased, that is, the Q of the loaded cavity must be reduced. Such a reduction results in a comparatively large decrease in the gap impedance and, thus, the klystron efficiency is appreciably lowered. Ideally, the load impedance should be about 1.5 times the beam impedance for optimum efficiency. However, other klystron design parameters, such as the electron beam perveance, normalized drift tube diameter, etc. will affect this optimum ratio.

One technique for improving the impedance match between the beam and the output circuit is to decrease the beam impedance by increasing its perveance, k. This method, however, has limited application because of the difficulties involved in electron gun design.

The generator-to-load impedance match may also be improved by resorting to a filter-loaded output circuit which increases the output cavity gap impedance over the operating band. In such a circuit, an RF filter cavity is placed between the load and the RF output cavity. The filter cavity must be designed to yield the required Q and resonant frequency. The difficulty in the design of such a broadband filter-loaded circuit is due to the high degree of coupling required between the load and the filter cavity. Loop coupling cannot be used for this purpose since the large loop dimensions necessary to achieve this amount of coupling introduce unwanted loop modes. A waveguide output circuit and waveguide coupling iris may be used in place of the loop and coaxial output line; however, this combination would not only be large and heavy, but would require a relatively large vacuum tight RF window. This is especially true at the lower microwave frequencies and U.H.F. frequencies.

It is, accordingly, a primary object of the present invention to provide a tunable, wideband, output circuit for use with linear beam devices.

Another object of the present invention is to provide a klystron amplifier of the type employing a single-gap output cavity which is capable of operating over a wide bandwidth.

Another object of the present invention is to provide a small, lightweight tunable, wideband output circuit for a klystron amplifier which consists in part of a single filter cavity that is capacitively tuned by a coaxial probe assembly which forms part of the output means.

Other objects, advantages and novel features of the invention will become apparent from the following detailed description of the invention when considered in conjunction with the accompanying drawings wherein:

FIG. 1 is a cross-sectional view of one preferred embodiment of the output cavity resonator circuit taken along a longitudinal axis of symmetry of the cavity resonators; and FIG. 2 is a cross-sectional view taken at line 2—2 in FIG. 1;

FIG. 3 illustrates one simplified arrangement for tuning the output cavity resonator circuit.

Briefly, and in somewhat general terms, the above objects of invention are accomplished by coupling to the output cavity of a kylstron, a second cavity which performs as a filter resonator. This coupling is achieved by a suitable inductive iris which forms part of a common wall structure between the two cavities. The filter resonator has a coaxial probe which both capacitively tunes this cavity and serves as a means for extracting the output signal in a mode-free manner. The combination of the two cavities results in an overall improvement in bandwidth response accompanied by a higher output cavity gap impedance for the klystron amplifier than would be the case with either of the individual cavities alone. Specifically, the bandpass response is flatter in the passband and the band edges drop off much steeper.

Referring now to FIG. 1 of the drawings, it will be seen that the overall output apparatus for the klystron amplifier, which provides the improved bandwidth, includes a single-gap cylindrical cavity 10 of conventional design, which interacts with the electron beam 11 in the usual manner to extract radio frequency energy therefrom. For simplicity sake, the structural details of the klystron tube are not shown. Reference may be had to U.S. Pat. No. 2,944,187 for the details of such a high power multi-cavity klystron amplifier tube. However, the upstream and downstream drift tubes 12 and 13, respectively, which are required in the performance of this tube and are supported from the top and bottom walls of cavity 10, are schematically illustrated in order to identify the function of this particular cavity.

A second cavity 15, whose dimensions may be similar to that of cavity 10, and which serves as the filter resonator previously mentioned, is coupled to cavity 10 by an inductive iris 14 which is formed in a plate 23 that fits within a suitable recess in the rim portion of cavity 10. This component is best shown in FIG. 2.

Filter cavity 15 has a coaxial probe 16 positioned along its vertical center line so as to coact with the electrical field present at this location. This probe, which behaves in this regard as a fixed tuning slug, as best shown in FIG. 1, consists in one form of an inner cylindrical conductor 17 having an enlarged diameter lower disc portion 18. Conductor 17 is, in fact, an extension of the inner conductor of a coaxial line whose outer conductor, in its lower end, takes the form of an upstanding flange 19 affixed to the top wall of cavity 15. The enlarged disc portion 18, it will be appreciated, functions as the stationary plate of a tuning capacitor. A similar disc 21 aligned therewith and supported from the lower wall portion serves as the displaceable plate of this device. This lower disc 21 is moveable in the axial direction, and this movement is permitted by bellows 22 which is affixed at one end to the lower rim of disc 21 and at the other end to the lower wall of cavity 15. Bellows 22 is securely affixed at both ends to maintain the vacuum integrity of the output circuit.

A simplified arrangement for tuning cavity 15 which allows controlled axial movement of the moveable tuning element is shown in FIG. 3. Here, again, a bellows 23 is secured to the lower rim of disc 21 and a confronting inner wall portion of cavity 15 to preserve the vacuum condition within the assembly. A lower body portion of the tuning slug where it extends beyond the wall portion of the cavity is threaded, and a captive nut 25 held in place by supporting element 26 upon rotation, displaces this slug in an axial direction to vary the distance between it and its companion disc 18.

An annular window 20 positioned within flange 19 supports inner conductor 17. This window also establishes a vacuum tight seal for isolating the interior of the cavities from the surrounding environment. The external load 22 is connected to the coaxial line by any suitable means.

The introduction of coaxial coupler 16 within filter cavity 15 permits this cavity to be tuned by adjusting the gap between discs 18 and 21. This capacitive loading reduces the resonant frequency of this cavity and, as a consequence, its size may be reduced. It would also be pointed out that the use of a coaxial type coupler for this purpose permits a comparatively small vacuum window 20 because of the area occupied by inner conductor 17. This tends to reduce the incidence of window failure due to thermal stresses arising from RF dissipation in the di-electric window material. Cavity 10 may be tuned in the conventional manner, i.e., with a diaphragm located in the cavity wall.

The combination of the two cavities shown in FIG. 1 provides a flatter response than that attainable with either the single-gap cavity 10 alone or the single filter cavity 15 alone.

Although the output cavity 10 for the klystron amplifier is shown as having a single-gap, it should be appreciated that the output circuit disclosed can be utilized with multi-gap structures. Likewise, it would also be pointed out that with the output apparatus disclosed, a comparatively wide bandwidth can be achieved with a minimum decrease in the gap impedance. Thus, the improved bandwidth performance is attained with only a relatively small decrease in efficiency. Moreover, the lower gap impedance allows a greater collector depression, and this tends to offset this decrease in efficiency.

What is claimed is:

1. A broadband output circuit for a high power modulated beam amplifier tube of the type utilizing a first cavity resonator having an electron beam interaction region therein comprising, in combination
    a filter cavity resonator coupled to said first cavity resonator; and
    means for capacitively tuning said filter cavity resonator and for coupling this cavity resonator to an external load,
        said means including a first longitudinal conductor supported from a wall portion of said filter cavity resonator and electrically insulated therefrom,
        said first conductor having an upper length portion which serves as the inner conductor of an output coaxial line and is outside of said filter cavity resonator and a lower length portion that extends into said filter cavity resonator a fixed distance and terminates in a planar end surface,
    a second conductor supported from an opposite wall portion of said filter cavity resonator and in coaxial alignment with said first conductor,
        said second conductor having an upper portion that extends into said filter cavity resonator and terminates in a planar end surface; and
    means for displacing said second conductor by controllable amounts in an axial direction thereby to vary the separation between said planar end surfaces.

2. In an arrangement as defined in claim 1 wherein said filter cavity resonator is coupled to said first cavity resonator by an inductive iris.

3. In an arrangement as defined in claim 1 wherein a dielectric window supports said first longitudinal conductor in a vertical manner.

4. In an arrangement as defined in claim 1 wherein said first longitudinal conductor is of cylindrical shape and terminates in a portion of increased diameter and wherein said second conducting element is also of cylindrical shape and terminates in a portion of increased diameter.

5. An output circuit for a high power modulated beam amplifier of the type wherein the modulated beam travels through a first cavity resonator having an electron beam interaction region, the combination of
    a second cavity resonator coupled to said first cavity resonator;
    an aperture formed in a top wall portion of said second cavity resonator;
    a first conductor;
    a dielectric window sealing said aperture and concentrically supporting said first conductor vertically such that an upper length portion thereof is outside of said second cavity resonator and a lower length portion thereof extends within said second cavity resonator a fixed distance,
        said upper portion serving as the inner conductor of an output coaxial line and said lower portion terminating in a planar surface which serves as one plate of a capacitor;
    a second conductor supported from a bottom wall portion of said second cavity resonator and having an upper length portion thereof which extends within said second cavity resonator and is in vertical alignment with said first conductor,
        said upper portion terminating in a planar surface which serves as the other plate of said capacitor,
        said second conductor being moveable in a vertical direction whereby the separation between said planar end faces may be varied.

6. A broadband output circuit for a high power klystron tube comprising, in combination
    a first cavity resonator adapted to be excited by the modulated electron beam of said klystron tube;
    a second cavity resonator;
    an inductive iris coupling said second cavity resonator to said first cavity resonator;
    first and second conductors supported by said second cavity resonator in spaced coaxial alignment with their confronting end portions positioned within said second cavity resonator,
        one of said conductors being electrically insulated from said second cavity resonator so as to provide a means for extracting an output signal from said second cavity resonator; and
    means for displacing the other of said conductors so as to vary the separation between said confronting end portions of said conductors.

* * * * *